United States Patent [19]
Kobayashi et al.

[11] Patent Number: 5,157,399
[45] Date of Patent: Oct. 20, 1992

[54] NEURAL NETWORK QUANTIZER

[75] Inventors: Seiji Kobayashi, Tokyo, Japan; Demetri Psaltis, Pasadena, Calif.

[73] Assignees: Sony Corporation, Tokyo, Japan; California Institute of Technology, Pasadena, Calif.

[21] Appl. No.: 744,115

[22] Filed: Aug. 15, 1991

[51] Int. Cl.$^5$ ............................................. H03M 1/34
[52] U.S. Cl. .................................. 341/163; 341/155; 341/200
[58] Field of Search ................. 341/133, 155, 163, 200

[56] References Cited

U.S. PATENT DOCUMENTS

4,926,180 5/1990 Anastassiou .................... 341/159

Primary Examiner—Marc Hoff
Attorney, Agent, or Firm—Alvin Sinderbrand; William S. Frommer

[57] ABSTRACT

A neural network quantizer for quantizing input analog signals includes a plurality of multi-level neurons. The input analog signals are sampled and supplied to respective ones of the multi-level neurons. Output values of the multi-level neurons are converted into analog values, weighted by weighting coefficients determined in accordance with a frequency band of at least one frequency component of the input analog signals and fed back to the respective one of the multi-level neurons and to the other multi-level neurons. The weighted analog values fed back are compared with the respective ones of the sampled input analog signals. The output values of the multi-level neurons are corrected in response to the compared results, and when the compared results are converged within a predetermined range, the output values of the multi-level neurons are produced to quantize the input analog signals.

6 Claims, 11 Drawing Sheets

NEURAL NETWORK QUANTIZER

BACKGROUND OF THE INVENTION

1. Field of the Invention

The present invention generally relates to quantizing apparatus and, more particularly, is directed to a neural network quantizer which quantizes an analog signal by using a multi-level neural network.

2. Description of the Prior Art

In the prior art, an analog signal may be quantized (digitized) by a quantization method which utilizes analog-to-digital (A/D) conversion. According to this quantization method utilizing A/D conversion, an input signal is sampled at an arbitrary moment, the sampled values obtained at every moment are classified in response to amplitudes and values corresponding to these classes are output.

This conventional method has an advantage, in that, the apparatus associated therewith has a relatively simple arrangement since the values are determined at every moment. On the other hand, characteristics in the frequency region are not at all considered. Such characteristics may include the noises generated by the quantization which are concentrated at a specific frequency. In the conventional apparatus, in order to make the concentrated noises appear inconspicuous white noise is added.

In accordance with the above-described conventional quantization method using A/D conversion, the signals lying in a frequency range from a DC component to $\frac{1}{2}$ of the sampling frequency are uniformly weighted and then converted as a result, when a desired signal exists only in one frequency band, the encoding efficiency is not satisfactory.

OBJECTS AND SUMMARY OF THE INVENTION

Accordingly, it is an object of the present invention to provide an improved neural network quantizer in which the aforementioned shortcomings and disadvantages encountered with the prior art are eliminated.

More specifically, it is an object of the present invention to provide a neural network quantizer which quantizes an analog signal by using a novel multi-level neural network.

According to an aspect of the present invention, a neural network quantizer comprises a plurality of multi-level neurons; means for supplying respective sample input analog signals to respective ones of the multi-level neurons; means for converting output values of the multi-level neurons into analog values; means for weighting the analog values by weighting coefficients determined in accordance with a frequency band of at least one frequency component of the input analog signals; means for feeding back each of the weighted analog values from the respective one of the multi-level neurons to all of the multi-level neurons; means for comparing the weighted analog values fed back with the respective ones of the sample input analog signals and providing corresponding compared results; and means for correcting the output values of the multi-level neurons in response to the compared results, so that, when the compared results are converged within a predetermined range, the output values of the multi-level neurons are produced to quantize the input analog signals.

The above, and other objects, features, and advantages of the present invention will become apparent from the following detailed description of an illustrative embodiment thereof when read in conjunction with the accompanying drawings.

DETAILED DESCRIPTION OF THE PREFERRED EMBODIMENT

The neural network quantizer according to an embodiment of the present invention will now be described in detail with reference to the accompanying drawings.

Figure 1:
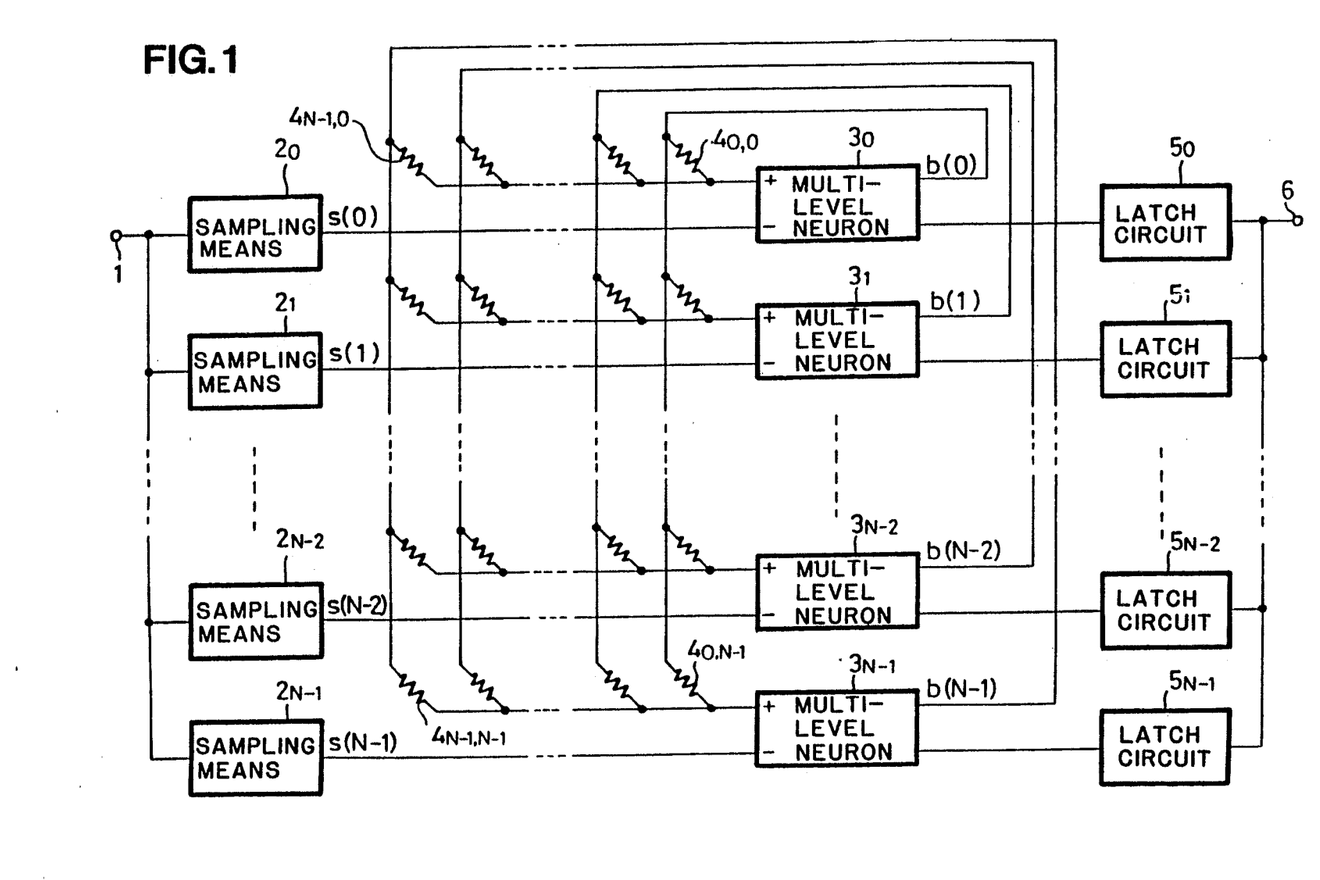
FIG. 1 is a functional block diagram of a neutral network quantizer according to an embodiment of the present invention.

FIG. 1 is a functional block diagram showing an overall arrangement of the present neural network quantizer.

In the quantizer of FIG. 1, an analog input signal is supplied through an analog signal input terminal 1; to sampling means $2_0$ to $2_{N-1}$ along with a sampling pulse which is sequentially supplied to the sampling means $2_0$ to $2_{N-1}$. As a result, sampled values are extracted from the next analog signal by the sampling means $2_0$ to $2_{N-1}$ and respectively supplied to one input terminal of multi-level neurons $3_0$ to $3_{N-1}$, which will be described later.

Output values in analog form, from these multi-level neurons $3_0$ to $3_{N-1}$ are respectively supplied through weighting resistors $4_{0,0} \ldots 4_{0,0} \ldots 4_{0,N-1} \ldots 4_{N-1,N-1}$ to the other input terminal of the multi-level neuron supplying the respective output value and to the other input terminal of the other remaining multi-level neurons. Output values, in digital form, from the multi-level neurons $3_0$ to $3_{N-1}$ are respectively supplied to latch circuits $5_0$ to $5_{N-1}$ which latch the output values produced when the calculation of the respective multi-level neuron is finished. The above-described sampling pulse is supplied to these latch circuits $5_0$ to $5_{N-1}$ so as to cause the latched values to be sequentially supplied to an output terminal 6.

Figure 2:
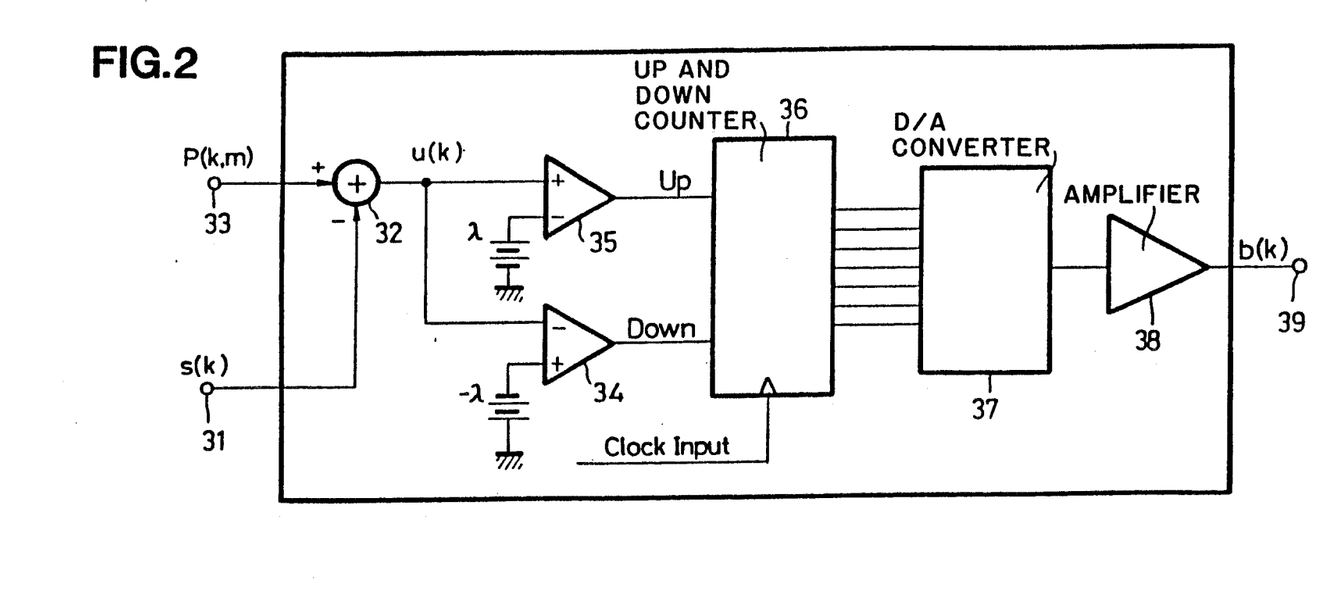
FIG. 2 is a functional block diagram of a multi-level neuron.

The multi-level neuron will now be more fully described with reference to FIG. 2. As shown therein, a signal is supplied through one input terminal to a subtracting input terminal of a subtracter 32 and a signal is supplied through another input terminal 33 to a positive input terminal of the subtracter 32. An output of the subtractor 32 is supplied to comparators 34 and 35 which respectively compare the level of the received output to levels of $-\lambda$ and $+\lambda$ so as to obtain the levels less than $-\lambda$ and higher than $+\lambda$. Outputs of the comparators 35 and 34 are respectively supplied to up and down input terminals of an up and down counter 36.

An arbitrary clock signal is supplied to a clock input of the up and down counter 36. A count value from the up and down counter 36 is supplied to a digital-to-analog (D/A) converter, whereupon the 37 value is converted from digital form to analog data and is thereafter supplied through an amplifier 38 having a predetermined amplification factor ($x \Delta$) so as to obtain an output analog value which is supplied to an output terminal 39. The count value from the up and down counter 36 is further supplied therefrom as an output value in digital form (not shown).

Figure 3:
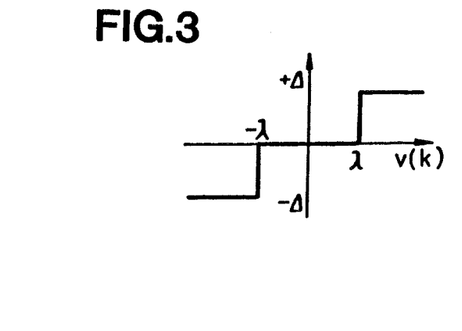
FIG. 3 is a diagram showing the transfer function of a neuron to which references will be made in explaining the multi-level neuron.

Accordingly, as shown in FIG. 3, when the output of the subtracter 32 (FIG. 2) is less than $-\lambda$, the output value of the multi-level neuron is decreased by $\alpha$, while when the output of the subtracter 32 is higher than $+\lambda$, the output value of the multi-level neuron is increased by $\alpha$. When the output of the subtracter 32 falls within a range of $\pm\lambda$ in all multi-level neurons $3_0$ to $3_{N-1}$, then the calculation has converged.

Referring again the above to described neural network quantizer, the weighting coefficients associated with the resistors $4_{0,0} \ldots 4_{0,N-1}$ to $4_{N-1,0} \ldots 4_{N-1,N-1}$ are determined as follows.

Figure 4:
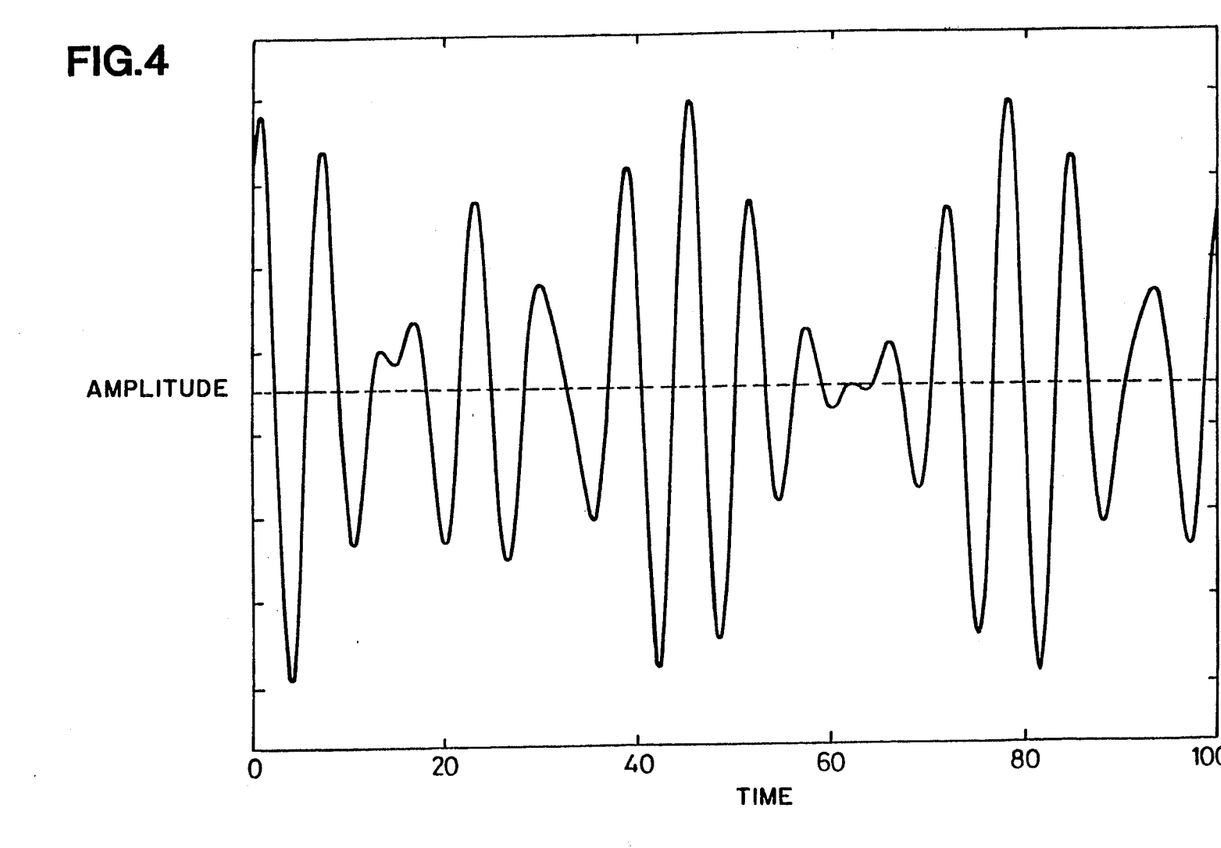
FIG. 4 is a waveform diagram of an input analog signal.
Figure 5:
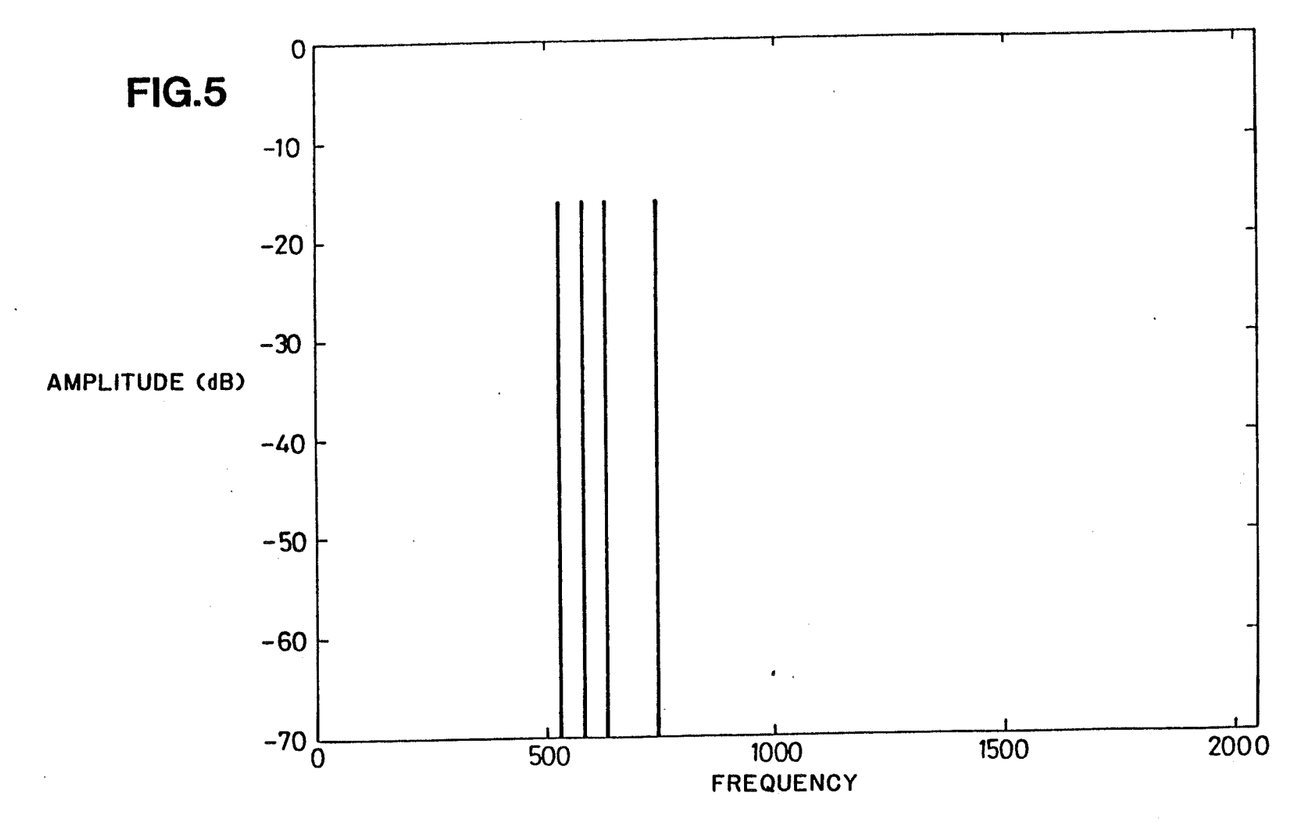
FIG. 5 is a frequency spectrum diagram of the input analog signal of FIG. 4.
Figure 6:
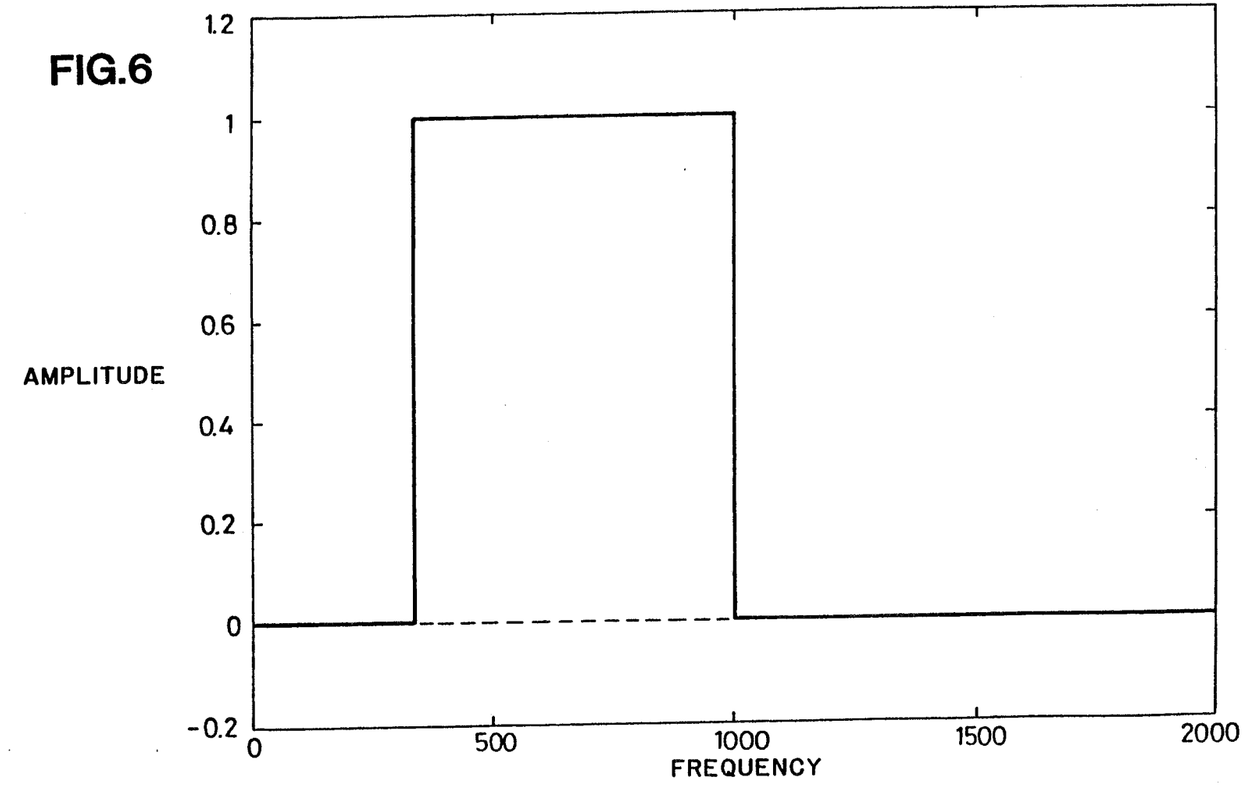
FIG. 6 is a diagram of a window.
Figure 7:
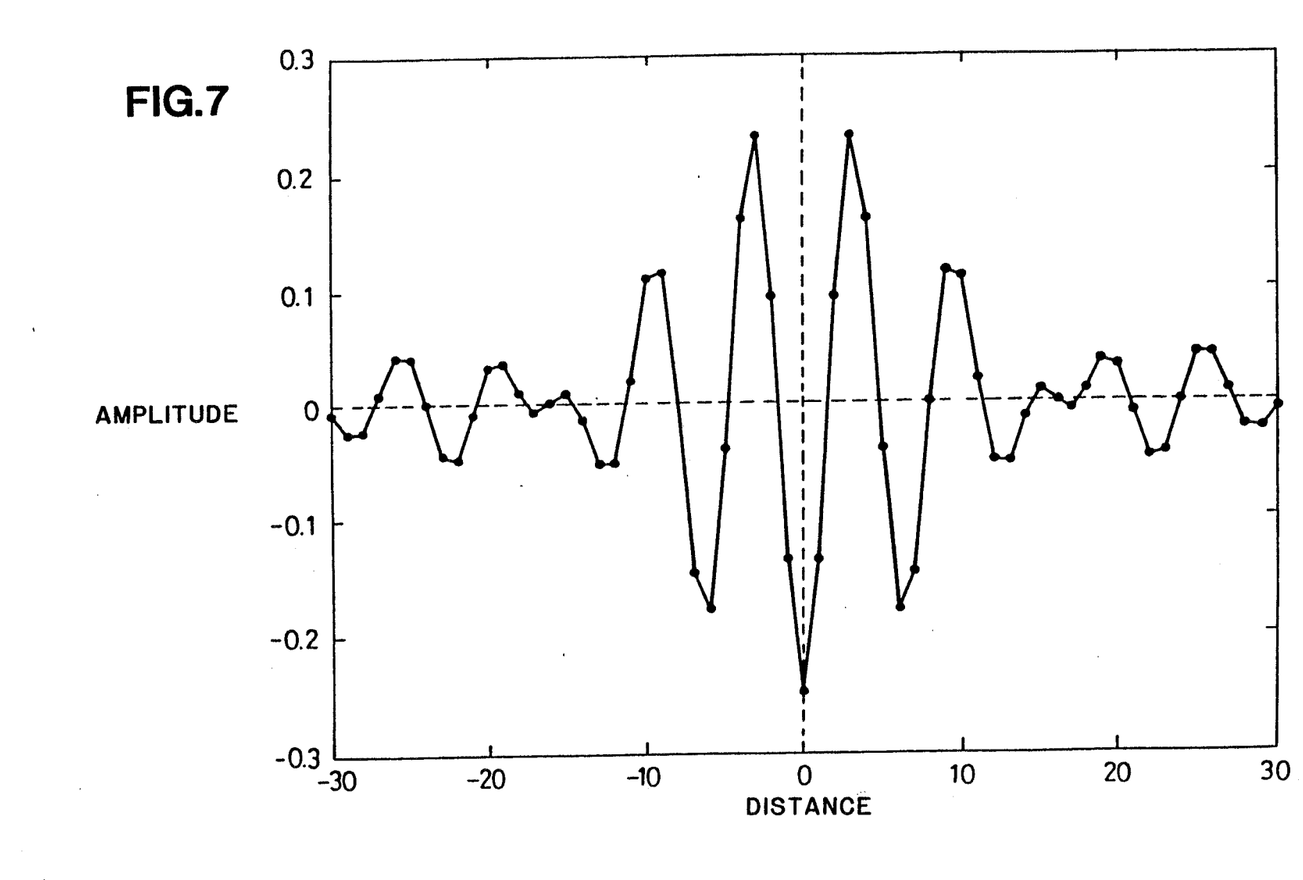
FIG. 7 is a diagram of a weighting function calculated from the window of FIG. 6.

Consider the situation in which an input analog signal as, for example, that shown in FIG. 4 which includes signals having four frequencies as shown in FIG. 5, is quantized as shown in FIG. 6, a window may be provided which has a frequency band which includes these four frequencies and has an amplitude value of 1 and in which the other remaining frequency bands have an amplitude value of 0. If the signals contained in this window are Fourier-transformed, the weighting coefficients (coupling coefficients) shown in FIG. 7 may be obtained. The abscissa in FIG. 7 indicates the distance between the multi-level neurons $3_0$ to $3_{N-1}$ (this distance value results from subtracting the suffix numeral of the neuron which outputs a respective value from the suffix numeral of the neuron which receives the value). Also, negative weighting is obtained by respectively connecting the resistors $4_{0,0} \ldots 4_{0,N-1}$ to $4_{N-1,0} \ldots 4_{N-1, N-1}$ to the terminals 31 of the multi-level neurons $3_0$ to $3_{N-1}$. Thus, the weighting of the resistors $4_{0,0} \ldots 4_{0,N-1}$ to $4_{N-1,0} \ldots 4_{N-1, N-1}$ is determined to quantize the input analog signal.

Figure 8:
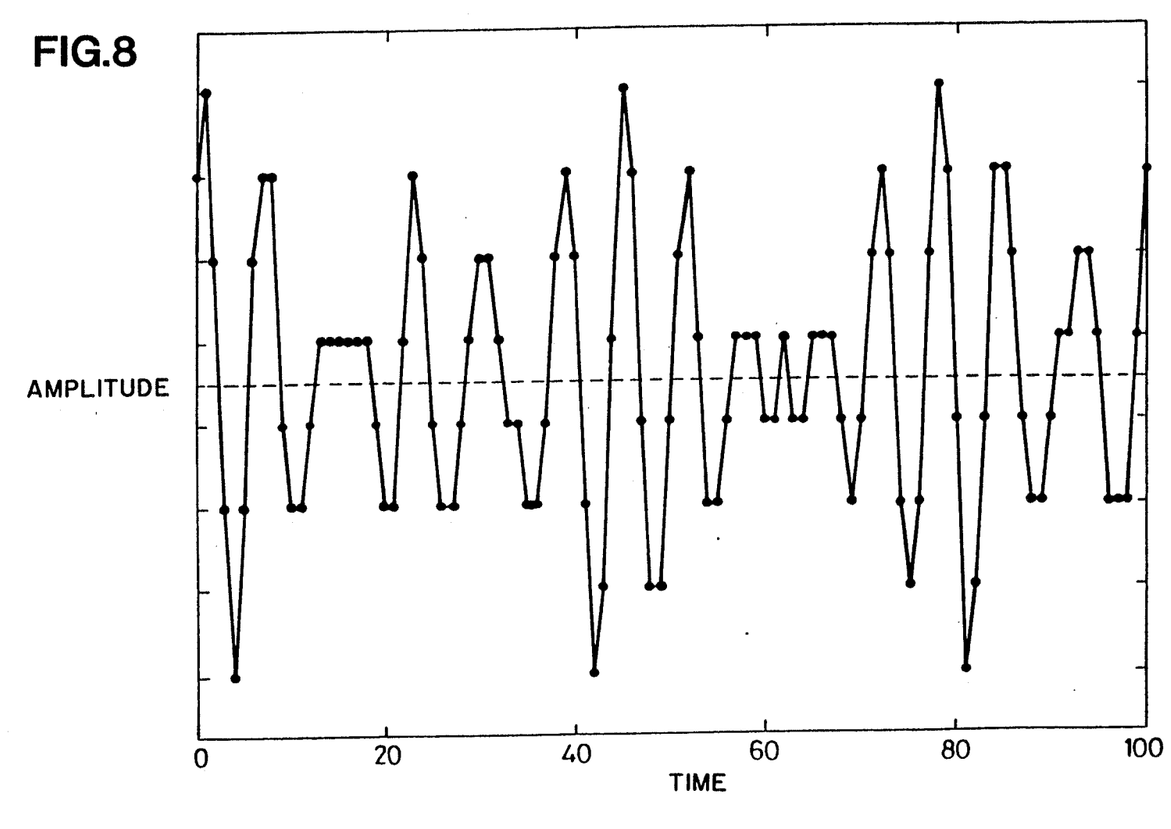
FIG. 8 is a diagram showing the level of a signal quantized by analog-to-digital (A/D) conversion.
Figure 9:
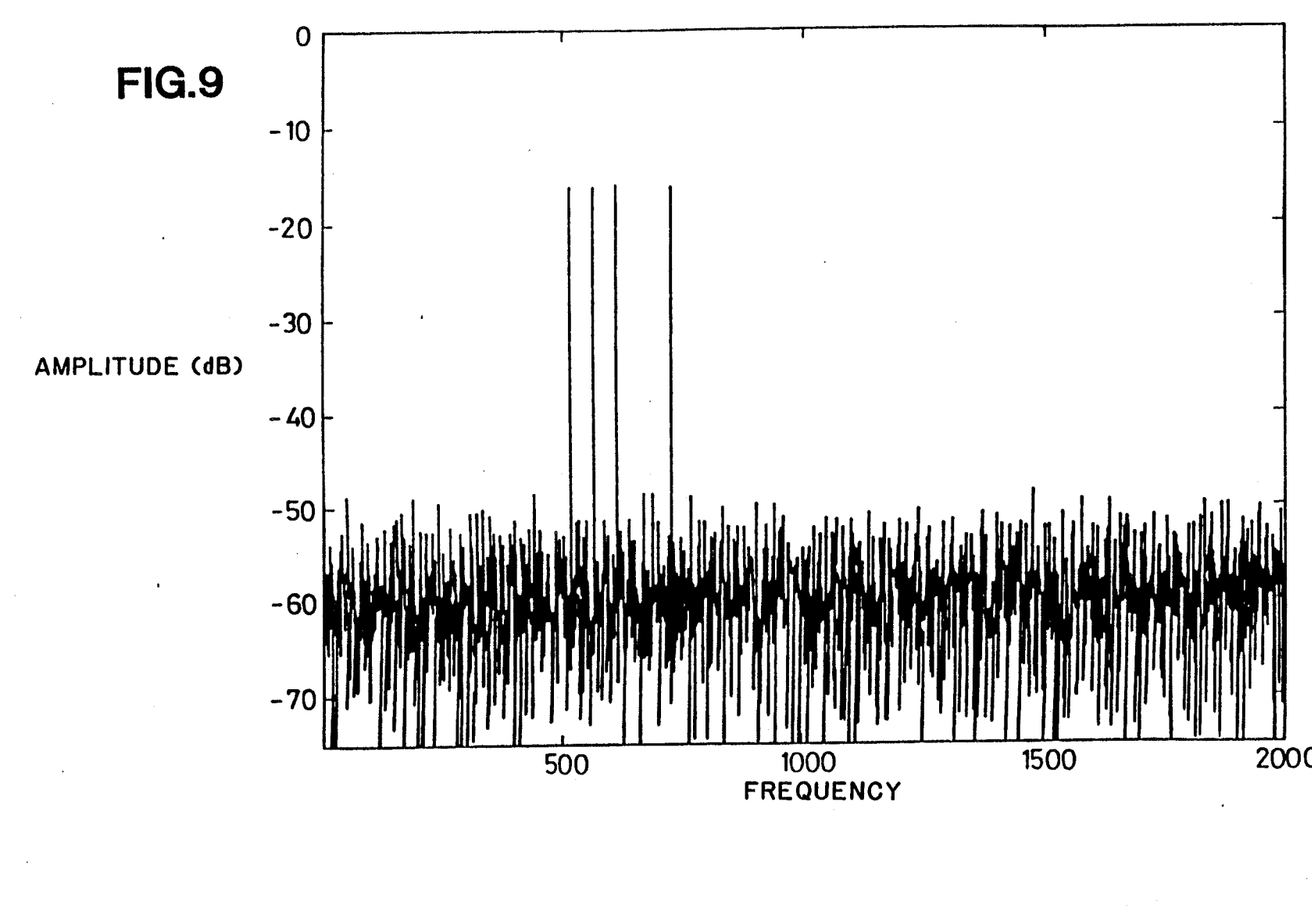
FIG. 9 is a frequency spectrum diagram of the quantized signal of FIG. 8.
Figure 10:
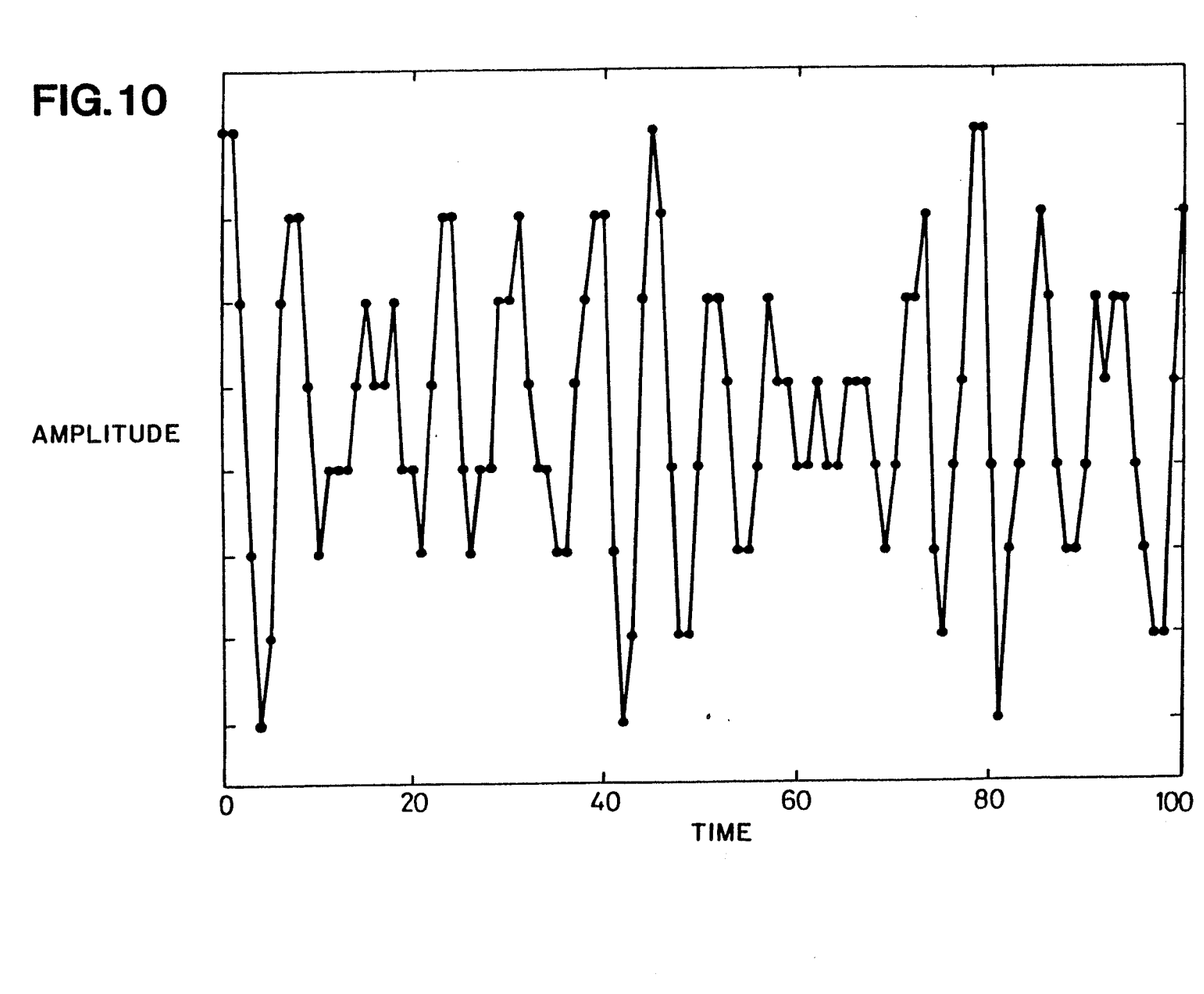
FIG. 10 is a diagram showing the level of the signal quantized using the quantizer according to the embodiment of present invention.
Figure 11:
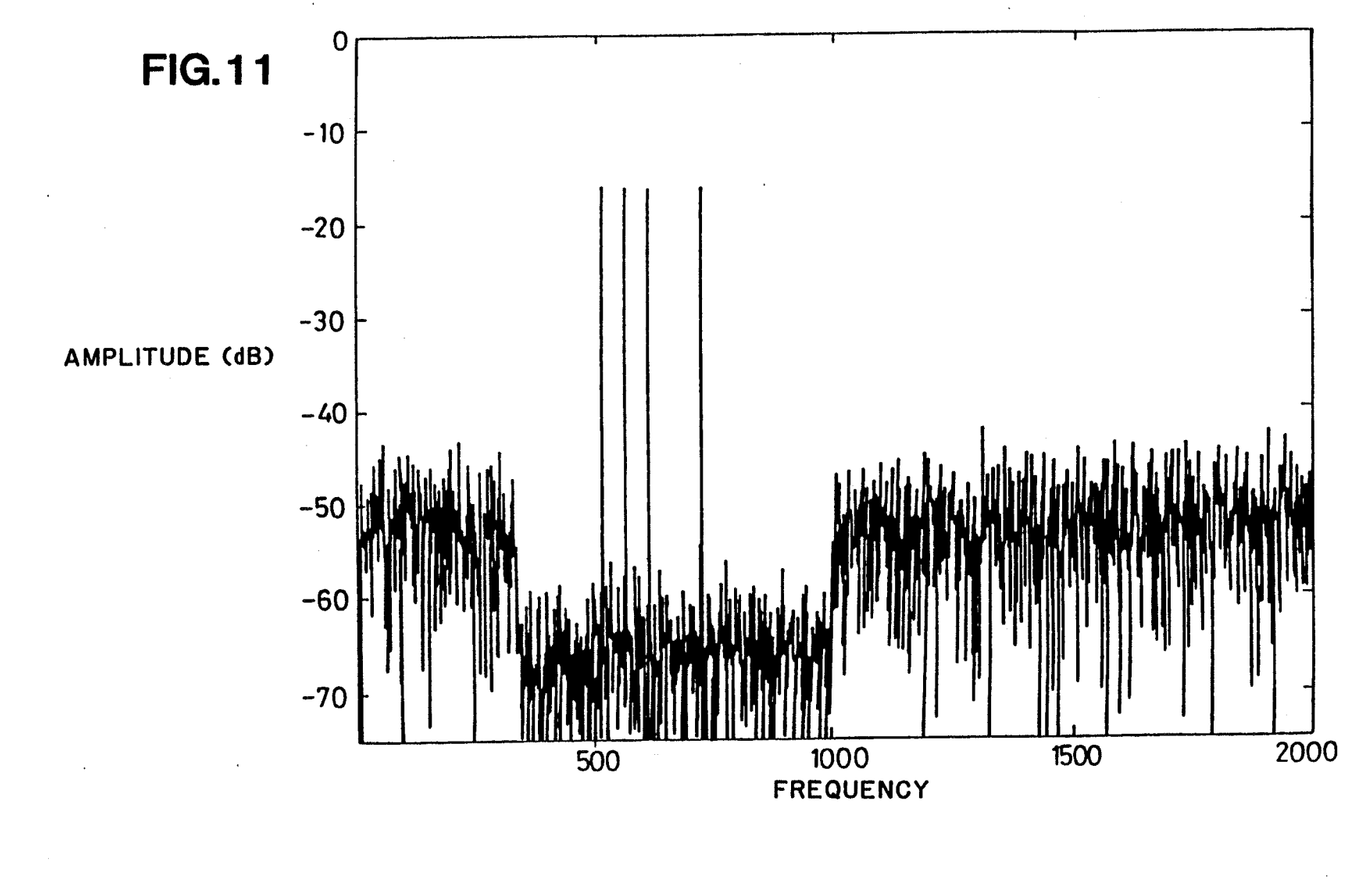
FIG. 11 is a frequency spectrum diagram of the quantized signal of FIG. 10.
Figure 12:
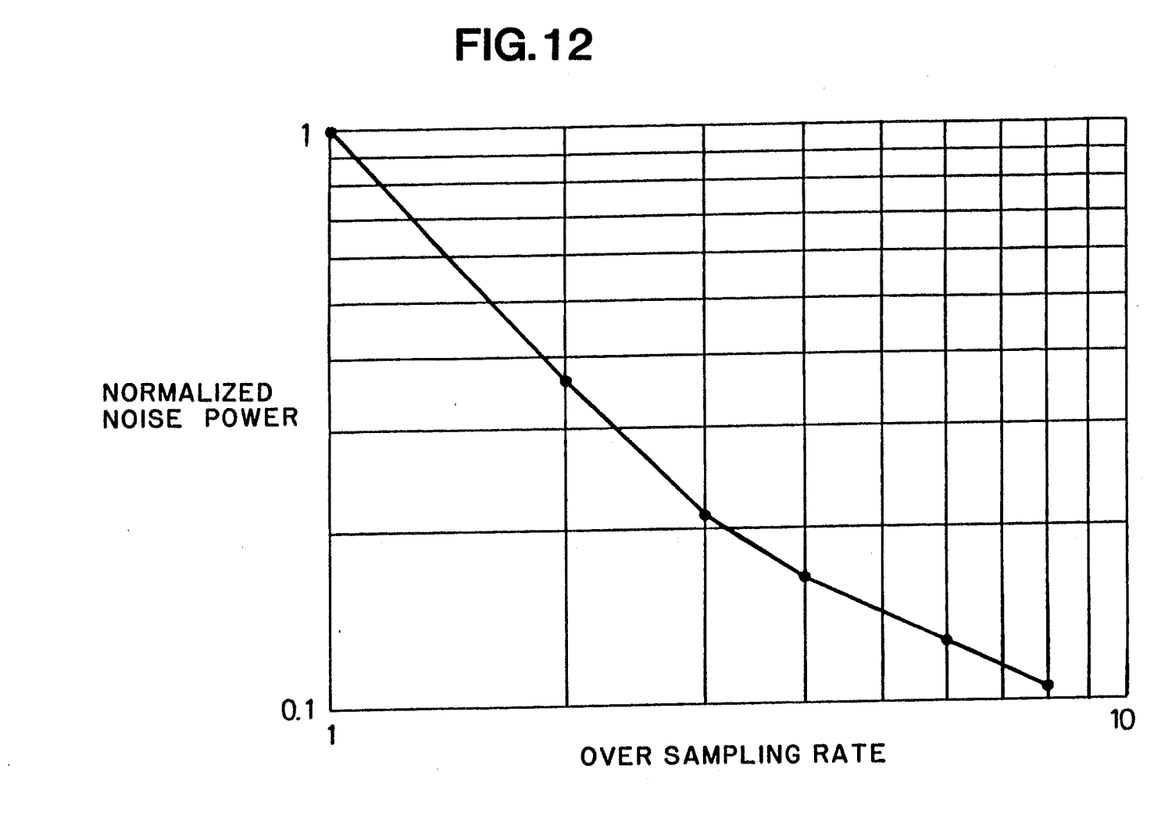
FIG. 12 is a graph illustrating the change of the noise power.

Quantization of the input analog signal, described above, may be performed by the conventional A/D conversion so as to obtain a quantized signal as shown in FIG. 8. If this quantized value is converted using spectrum analysis techniques so as to obtain the frequency spectrum, noise is produced throughout the entire spectrum as shown in FIG. 9. On the other hand, if the input analog signal is quantized by the above described apparatus, then the obtained quantized signal is somewhat different from the original waveform as shown in FIG. 10. However, if the resultant quantized value is converted using spectrum analysis techniques so as to obtain the frequency spectrum, as shown in FIG. 11, the original four frequencies are obtained with a reduced noise level in the frequency band of the previously defined window. FIG. 12 shows how the noise power within the window is reduced as a function of the inverse radio of the width of the window relative to the width of the whole band. For example, if the width of the window is selected to be $\frac{1}{8}$ of the whole band width, then the noise power can be reduced to about 0.1 of the noise power associated with a window having a width equal to the whole band. Likewise, if the width of the window is selected to be $\frac{1}{2}$ of the whole band width, then the noise power can be reduced to about 0.35 of the noise power associated with a window having a width equal to the whole band.

The numbers labeled on the axis in FIGS. 4-11 which do not have specific units identified therewith are provided so as to show relative values.

As described above, the input analog signal supplied to the input terminal 1 is quantized and then fed to the output terminal 6. According to the above apparatus, when the input analog signal is A/D converted, the noise in the band defined as the window can be reduced so that acceptable quantization can be effected.

More specifically, assume that g(t) represents an input signal and g(n) (n=0,1, ... N-1) represents a result obtained by sampling the input signal g(t) by a relatively high sampling frequency. Incidentally, g(t) may be an analog signal stored in a sample and hold circuit or a digital signal quantized with high accuracy by a relatively high-accurate A/D converter.

Further, assume that b(n) represents a quantized signal, in which b(n) may have M kinds of discrete values from $-1$ to $+1$.

In this situation the above apparatus may be requested to determine the signal b(n) such that the difference between the above original signal g(n) and the signal b(n) may be minimized after having been multiplied by a frequency window function W(k).

Accordingly, if a scaling factor determined by the apparatus is represented by $\alpha$ and if E represents an energy function, then the following equation is established:

$$E = \sum_k |\{G(k) - \alpha B(k)\} \cdot W(k)|^2 \tag{1}$$

Thus, in the above-described situation, the signal b(n) is selected so that the energy function E may be minimized. In equation 1, G(k) and B(k) are Fourier transforms of the signals g(n) and b(n), respectively. Also, W(k) is the window function which designates the frequency region from which the noise is to be removed or reduced. For example, W(k) can be defined as, $$W(k) = \begin{cases} 1 & \text{if noise is to be removed} \\ 0 & \text{if noise is permitted.} \end{cases}$$

On the other hand, equation (1) may be converted into an equation in the time domain by Parsevals's theorem, and by substituting the Fourier transform of W(k), that is, w(n) the following equation is produced:

$$E = \sum_{n=0}^{N-1} |\{g(n) - \alpha b(n)\} * w(n)|^2 \tag{2}$$

where * denotes convolution.

Further, if g(n) represents the convolution between g(n) and the window function, the following expression may be obtained:

$$g(n) = g(n) * w(n) = \sum_{i=0}^{N-1} g(i)w(i-n)$$

Thus, the following equation is established.

$$E = \alpha^2 \sum_{n=0}^{N-1} \left( \sum_{i=0}^{N-1} b(i) \cdot w(i-n) \sum_{j=0}^{N-1} b(j) \cdot w(j-n) \right) - \quad (3)$$

$$2\alpha \sum_{n=0}^{N-1} g(n) \sum_{i=0}^{N-1} b(i) \cdot w(i-n) + C$$

where C is a constant term that does not depend on b(n).

Further, exchanging the integrating order and the variable names results in the following equation:

$$E = \alpha^2 \sum_{m=0}^{N-1} \sum_{n=0}^{N-1} b(m) \cdot b(n) \sum_{i=0}^{N-1} w(m-i) \cdot w(n-i) - \quad (4)$$

$$2\alpha \sum_{n=0}^{N-1} b(n) \sum_{i=0}^{N-1} g(i) \cdot w(n-i) + C$$

The terms P(m,n) and S(n) are defined as follows:

$$\left. \begin{array}{l} P(m,n) = -2\alpha \sum_{i=0}^{N-1} w(m-i) \cdot w(n-i) \\ S(n) = -2 \sum_{n=0}^{N-1} g(i) \cdot w(n-i) \end{array} \right\} \quad (5)$$

where P(m,n) is the auto-correlation of the Fourier transform of the window function, multiplied by the scaling factor $\alpha$. Due to the properties of the auto-correlation function and since the scaling factor $\alpha$ is positive, the following expressions are obtained:

$$P(m,n) \leq 0 \quad (6)$$

$$P(m,n) = P(n,m) \quad (7)$$

Further, substituting the terms of equation (5) into equation (4), results in the following equation:

$$E = \quad (8)$$

$$\alpha \left( -\frac{1}{2} \sum_{n=0}^{N-1} \sum_{m=0}^{N-1} b(m)P(m,n)b(n) + \sum_{n=0}^{N-1} b(n)S(n) \right) + C$$

Because the term C is a constant term and, as a result, cannot be reduced or minimized, the value of b(n) is determined which minimizes the energy function E without the constant term C which may be written as follows:

$$E = -\frac{1}{2} \sum_{n=0}^{N-1} \sum_{m=0}^{N-1} b(m)P(m,n)b(n) + \sum_{n=0}^{N-1} b(n)S(n) \quad (9)$$

The above-described operation may be performed by the multi-level neural network using the multi-level neuron.

That is, in the above apparatus, each neurons can output discrete values from $-1$ to $+1$. Further, each of the neurons are respectively coupled by the weighting coefficients P(m,n), so as to form the multi-level neural network. Here, an input u(k) of the k'th neuron is formed from the sum of the outputs of the neurons and a threshold value s(k) of each neuron and may be expressed as follows:

$$u(k) = \sum_{n=0}^{N-1} P(k,n)b(n) - S(k) \quad (10)$$

If the value of u(k) is larger than the dead zone $\pm \lambda$, as shown in FIG. 3, then the neuron changes its output $+$ or $-$ by $\Delta$, respectively.

The output change at a timing point $t+1$ can be expressed as follows:

$$b_{t+1}(k) - b_t(k) = \begin{cases} -\Delta & u(k) < -\lambda \\ 0 & |u(k)| \leq \lambda \\ +\Delta & u(k) > +\lambda \end{cases} \quad (11)$$

Here, the step change $\Delta$ and the width $\lambda$ of the dead zone may be determined by the following expressions:

$$\Delta = \frac{2}{(M-1)} \quad (12)$$

$$\lambda = \frac{1}{2} \Delta |P(k,k)|$$

In this case, however, the output of each neuron is saturated in a range from $-1$ to $+1$ so that, in actual practice, the output of the k'th neuron at the timing point $t+1$ may be expressed as follows:

$$b_{t+1}(k) = \begin{cases} b_t(k) + \Delta & \text{if } |b_t(k)| < 1 \\ b_t(k) & \text{in all other cases than} \end{cases} \quad (13)$$

Further, the following discussion will show that the multi-level neural network described above operates with a relatively low energy level E'.

Energy at timing point t is expressed as follows:

$$E(t) = -\frac{1}{2} \sum_{m=0}^{N-1} \sum_{n=0}^{N-1} b_t(m)P(m,n)b_t(n) + \sum_{n=0}^{N-1} b_t(n)S(n) \quad (14)$$

Then, assume that the k'th neuron changes its output at the timing point $t+1$ in a manner similar to that defined by equation 13, is, in accordance with the following equation:

$$b_{t+1}(n) = \begin{cases} b_t(n) + \Delta & \text{if } n = k \\ b_t(n) & \text{in all other cases} \end{cases}$$

in all other cases calculating the energy at the timing point $t+1$ by utilizing P(m,n) = P(n,m) which, as previously described, is a characteristic of the auto correlation function, results in the following expression:

$$E(t+1) = -\frac{1}{2} \sum_{m=0}^{N-1} \sum_{n=0}^{N-1} b_t(m)P(m,n)b_t(n) + \quad (15)$$

-continued $$\sum_{n=0}^{N-1} b_r(n)S(n) - \Delta \sum_{n=0}^{N-1} P(k,n)b_r(n) + \Delta S(k) - \tfrac{1}{2}\Delta^2 P(k,k)$$

Accordingly, the difference between the energies of timing point t+1 and timing point t is expressed as follows:

$$E'(t+1) - E'(t) = \qquad (16)$$

$$-\Delta\left(\sum_{n=0}^{N-1} P(k,n)b_r(n) + S(k)\right) - \tfrac{1}{2}\Delta^2 P(k,k)$$

As is to be appreciated, if $\Delta=0$, then the energy of timing point t+1 has not changed from that of timing point t.

Further, the change of energy in the case of $\Delta=1$ or $\Delta=-1$ is readily available. For example, if $\Delta=1$, then the equation (10) yields:

$$u(k) > -\tfrac{1}{2}P(k,k) \qquad (17)$$

Substituting this relation into equation (16), results in the following equations:

$$E'(t+1) - E'(t) = \qquad (18)$$

$$-\Delta[u(k)] - \tfrac{1}{2}\Delta^2 P(k,k) < \tfrac{1}{2}P(k,k) - \tfrac{1}{2}P(k,k)$$

Thus, $$E'(t+1) - E'(t) < 0$$

If $\Delta=-1$, then the above proposition can be proved in exactly the same manner. That is, it can be proved that this multi-level neural network operates so as to constantly lower the energy. Accordingly, in the above apparatus, if a proper initial value is input to N multi-level neurons and the multi-level neural network is operated, then the calculations performed by this neural network will converged to b(n). While the above-described multi-level neural network was applied to the situation in which the input analog signal is a one-dimensional signal such as an audio signal, the apparatus maybe expanded in a two-dimensional fashion, no that the multi-level neural network system of the present invention can also be applied to image processing.

Having described the preferred embodiment of the invention with reference to the accompanying drawings, it is to be understood that the invention is not limited to that precise embodiment and that various changes and modifications thereof could be effected by one skilled in the art without departing from the spirit or scope of the invention as defined in the appended claim.

We claim as our invention:

1. A neural network quantizer comprising:
a plurality of multi-level neurons;
means for supplying respective sampled input analog signals to respective ones of said multi-level neurons;
means for converting output values of said multi-level neurons into analog values;
means for weighting said analog values by weighting coefficients determined in accordance with a frequency band of at least one frequency component of said input analog signals;
means for feeding back each of the weighted analog values from the respective one of said multi-level neurons to all of said multi-level neurons;
means for comparing the weighted analog values fed back with the respective ones of said sampled input analog signals and providing corresponding compared results; and
means for correcting the output values of said multi-level neurons in response to said compared results, so that, when the compared results are converged within a predetermined range, the output values of said multi-level neurons are produced to quantize said input analog signals.

2. A neural network quantizer for quantizing analog signals composed of at least one component signal having a respective frequency, said neural network quantizer comprising:
a plurality of sampling means for receiving and sampling said analog signals so as to form respective sampled analog signals;
weighting means for forming a plurality of respective weighted analog signals in accordance with weighting coefficients obtained by processing signals contained within a frequency band, said frequency band including each said respective frequency of each said component signal;
a plurality of multi-level neuron means for generating respective output signals, in which each of said multi-level neuron means includes comparing means for comparing respective ones of said weighted analog signals and said sampled analog signals so as to form a comparison signal, means for processing said comparison signal so as to form the respective output signal, and means for converting the respective output signal to an output analog signal for supply to said weighting means along with the output analog signals of the other said multi-level neuron means so as to form said respective weighted analog signals; and
means for obtaining the quantized analog signals from said output signals of said multi-level neuron means when the comparison signals converge to values which lie within a predetermined range.

3. A neural network quantizer according to claim 2, in which the respective output signal from each said means for converting is fed back through said weighting means so as to form the respective weighted analog signals to the respective one of said multi-level neuron means and to the other remaining said multi-level neuron means.

4. A neural network quantizer according to claim 3, in which said means for obtaining the quantized analog signals includes a plurality of means for latching said output signals and in response to a sampling pulse for supplying the latched output signals therefrom.

5. A neural network quantizer according to claim 3, in which each said comparing means includes subtraction means for subtracting the respective sampled analog signal from the respective weighted analog signal.

6. A neural network quantizer according to claim 3, in which said means for processing said comparison signal includes up and down counter means for increasing and decreasing amplitudes of the respective output signal.

* * * * *